(12) United States Patent
Asamura et al.

(10) Patent No.: US 8,451,068 B2
(45) Date of Patent: May 28, 2013

(54) OSCILLATOR

(75) Inventors: Fumio Asamura, Sayama (JP);
Takehito Ishii, Sayama (JP)

(73) Assignee: Nihon Dempa Kogyo Co., Ltd., Tokyo (JP)

( * ) Notice: Subject to any disclaimer, the term of this patent is extended or adjusted under 35 U.S.C. 154(b) by 63 days.

(21) Appl. No.: 13/137,922

(22) Filed: Sep. 21, 2011

(65) Prior Publication Data
US 2012/0068776 A1    Mar. 22, 2012

(30) Foreign Application Priority Data
Sep. 22, 2010   (JP) .............................. P.2010-212855

(51) Int. Cl.
*H03B 5/30*   (2006.01)
(52) U.S. Cl.
CPC .......... *H03B 5/30* (2013.01); *H03B 2200/0034* (2013.01); *H03B 2200/0088* (2013.01)
USPC ..................... 331/74; 331/116 R; 331/116 M; 331/154
(58) Field of Classification Search
CPC ............... H03B 5/30; H03B 2200/0016; H03B 2200/0034; H03B 2200/0088; H03B 2202/02
USPC ............. 331/74, 116 R, 116 M, 116 FE, 154, 331/156, 158
See application file for complete search history.

(56) References Cited

U.S. PATENT DOCUMENTS
4,926,143 A * 5/1990 Harada et al. .................. 331/156
2007/0257740 A1* 11/2007 Boser et al. .................... 331/154

FOREIGN PATENT DOCUMENTS
JP   H05-067042   9/1993
JP   2005-184851   7/2005
JP   2006-311423   11/2006

OTHER PUBLICATIONS

Nguyen, CT-C., and Roger T. Howe. "An integrated CMOS micromechanical resonator high-Q oscillator." Solid-State Circuits, IEEE Journal of 34.4 (1999): 440-455.*
Yu-Wei Lin et al., "60-MHz wine glass micromechanical disk reference oscillator," Digest of Technical Papers, 2004 IEEE International Solid-State Circuits Conference, San Francisco, California, Feb. 15-19, 2004, pp. 322-323.

* cited by examiner

Primary Examiner — Ryan Johnson
(74) Attorney, Agent, or Firm — Jacobson Holman PLLC

(57) ABSTRACT

Provided is an oscillator using an MEMS resonator, which can reduce an influence of noise of a TIA and improve phase noise characteristics of an oscillator output. The oscillator includes an MEMS resonator, a TIA, a buffer amplifier, and a current/voltage converter that couples, by electromagnetic induction, with a wiring line via which an output of the MEMS resonator is fed to the TIA, so as to convert a current flowing in the wiring line to a voltage and output the voltage to the buffer amplifier. Thus, the oscillator output is extracted from the current/voltage converter. Further, the current/voltage converter is provided in the form of an oscillation output coil provided so as to surround the wiring line in a noncontact manner, in which oscillation output coil one end is connected to ground and the other end is connected to the buffer amplifier.

6 Claims, 4 Drawing Sheets

OSCILLATOR

This application has a priority of Japanese no. 2010-212855 filed Sep. 22, 2010, hereby incorporated by reference.

BACKGROUND OF THE INVENTION

1. Field of the Invention

The present invention relates to an oscillator, especially an oscillator that can improve phase noise characteristics.

2. Description of the Related Art

DESCRIPTION OF THE PRIOR ART

As a conventional oscillator, there has been an oscillator that uses a resonator having a relatively large equivalent series resistance (for example, 500Ω or more). Especially, some MEMS (Micro Electro Mechanical Systems) oscillators use, as an amplifying element for oscillations, a transimpedance amplifier (TIA).

The conventional oscillator is explained below with reference to FIG. 7. FIG. 7 is a circuit diagram illustrating an example of an oscillator using a conventional MEMS resonator.

As illustrated in FIG. 7, the conventional oscillator includes an MEMS resonator 7, a TIA 5, and a buffer amplifier 9.

The TIA 5 is an amplifying element for oscillations, and is constituted by an operation amplifier 6 and a negative feedback resistor 8. Further, a resonator bias 10 is applied to the resonator 7. Thus, an output of the TIA 5 is extracted as an oscillation output via the buffer amplifier 9.

The reason why the oscillation output is extracted from a TIA output is because the TIA is an element for current input/voltage output, and therefore it is easier to extract oscillation amplitude based on a voltage.

[Configuration of MEMS Resonator: FIG. 8]

Next will be explained a configuration of the conventional MEMS resonator with reference to FIG. 8. FIG. 8 is a cross-sectional explanatory diagram illustrating a conventional disk-type MEMS resonator.

As the conventional disk-type MEMS resonator, there is such a resonator in which a disk-shaped resonating element 23 (hereinafter referred to as a disk 23) is supported at two points, and four electrodes 24 are disposed around the disk 23. A gap 25 is formed between the disk 23 and each of the electrodes 24 so that the disk extends and contracts in a diameter direction due to electrostatic oscillations.

As illustrated in FIG. 8, the conventional MEMS resonator is configured such that a silicon nitride film 22 is laminated on an SOI substrate in which an oxide film ($SiO_2$) 21 is provided on silicon (Si) 20, and the disk 23 made from polycrystalline silicon (polysilicon), the electrodes 24, and wiring lines 26 are provided thereon. Between the disk 23 and each of the electrodes 24, a gap 25 is formed by sacrifice layer etching of the oxide film.

[Phase Noise of TIA]

Incidentally, in the conventional oscillator, since the oscillator output is extracted from the TIA output, high-level floor noise of the TIA is added to phase noise of the oscillator, thereby deteriorating noise floor of the phase noise of the oscillator output.

For example, the noise floor (60 MHz, 100 kHz offset) of the phase noise of the oscillator using the conventional MEMS resonator is about −130 dBc/Hz, which is about 20 dB lower than a TCXO (Temperature Compensated Crystal Oscillator) having similar frequencies. As a result, applications to which the oscillator is applicable are limited and a large restriction is caused.

RELATED ART

Techniques related to the resonator have been disclosed in Japanese Patent Application Publication No. 2005-184851 (Applicant: SAMSUNG ELECTRONICS CO., LTD., Patent Document 1), Japanese Patent Application Publication No. 2006-311423 (Applicant: FUJITSU COMPONENT LIMITED, Patent Document 2), Japanese Utility Model Application Publication No. 05-067042 (Applicant: JALCO CO., LTD., Patent Document 3).

Patent Document 1 discloses that in a duplexer, a coil-shaped inductor is provided in an isolating portion between a transmitting port filter and a receiving port filter.

Patent Document 2 discloses that a coil-shaped electrode is provided in an MEMS resonator.

Patent Document 3 discloses a configuration of a high-frequency circuit in which a wire is wound in a coil shape.

Further, Non-Patent Document 1, which will be described later, discloses a configuration and characteristics of an oscillator using an MEMS resonator.

[Patent Document 1] Japanese Patent Application Publication No. 2005-184851

[Patent Document 2] Japanese Patent Application Publication No. 2006-311423

[Patent Document 3] Japanese Utility Model Application Publication No. 05-067042

[Non-Patent Document 1] Yu-Wei Lin et al.: "60-MHz Wine-Glass Micromechanical-Disk Reference Oscillator", 2004 IEEE International Solid-State Circuit Conference, Session 17, MEMS AND SENSORS, 17.7

SUMMARY OF THE INVENTION

However, the oscillators using a conventional MEMS resonator have such a problem that since an oscillation output is extracted from a TIA output in which high-level floor noise is contained, the noise floor of the phase noise of the oscillator output is deteriorated.

The present invention is accomplished in view of the above problem. An object of the present invention is to provide an oscillator that can improve phase noise characteristics.

The present invention for solving the problem of the conventional examples is an oscillator including: a resonator provided on a substrate; an amplifying element for oscillations; a buffer amplifier for extracting an oscillator output; and current/voltage converting means that couples, by electromagnetic induction, with an input wiring line via which an output of the resonator is fed to the amplifying element, so as to convert a current flowing in the input wiring line to a voltage and output the voltage to the buffer amplifier. With the configuration, the present invention yields such an effect that an influence of noise can be reduced and the phase noise characteristics of the oscillator output can be improved.

Further, in the present invention, the above oscillator is configured such that the current/voltage converting means is a coil provided so as to surround the input wiring line in a noncontact manner, in which coil one end is connected to ground and the other end is connected to the buffer amplifier. In the configuration, the oscillator output is extracted not from an output side of the amplifying element for oscillations but from the buffer amplifier via the coil. Accordingly, noise generated in the amplifying element for oscillations is blocked at the resonator. As a result, the present invention yields such an effect that an influence of the noise can be reduced and the phase noise characteristics of the oscillator output can be improved.

Further, in the present invention, the above oscillator is configured such that the current/voltage converting means is a microstrip line placed adjacently to and substantially in parallel with the input wiring line, in which microstrip line one end is connected to ground and the other end is connected to the buffer amplifier. With the configuration, even if an oscillation frequency becomes high, capacitance is hardly formed. Accordingly, the oscillator is applicable at high frequencies. Thus, the present invention yields such an effect that the phase noise characteristics of the oscillator output at high frequencies can be improved.

Moreover, in the present invention, the above oscillator is configured such that the current/voltage converting means is a transformer constituted by a first coil and a second coil, the first coil is provided on the input wiring line, and the second coil in which one end is connected to ground and the other end is connected to the buffer amplifier is provided opposed to the first coil.

Further, in the present invention, the above oscillator is configured such that the first coil and the second coil are placed in parallel with each other in a horizontal direction with respect to the substrate. With the configuration, the present invention yields such an effect that the number of layers to be formed in a coil forming process can be reduced, thereby reducing production cost.

Furthermore, in the present invention, the above oscillator is configured such that the first coil and the second coil are placed so that they are superimposed one on the other via an insulating layer in a vertical direction with respect to the substrate. With the configuration, the present invention yields such an effect that an area necessary for the coils to be placed is reduced, thereby making it possible to downsize the oscillator in total.

DESCRIPTION OF REFERENCE NUMERALS

Figure 1:
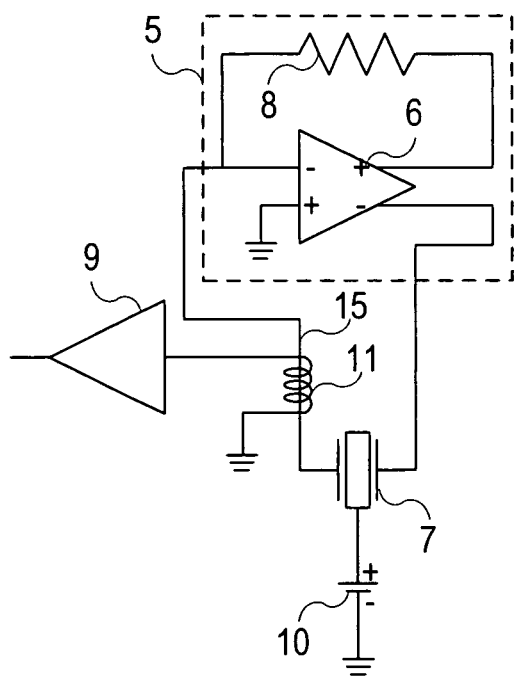
FIG. 1 is a circuit diagram of an oscillator according to the first embodiment of the present invention.

5 . . . TIA, 6 . . . Operation Amplifier, 7 . . . MEMS Resonator, 8 . . . Negative Feedback Resistor, 9 . . . Buffer Amplifier, 10 . . . Resonator Bias, 11 . . . Oscillation Output Coil, 12 . . . TIA-input-side Coil, 13 . . . Oscillation-output-side Coil, 15 . . . TIA-input-side Wiring Line, 16 . . . Microstrip Line, 20 . . . Silicon Substrate, 21 . . . Oxide Film, 22 . . . Silicon Nitride Film, 23 . . . Disk, 24 . . . Electrode, 25 . . . Gap, 26 . . . Wiring Line

DESCRIPTION OF THE PREFERRED EMBODIMENT

The following describes a preferred embodiment of the present invention with reference to drawings.
Summary of Preferred Embodiment An oscillator according to the preferred embodiment of the present invention includes current/voltage converting means which couples by electromagnetic induction, with a wiring-line section via which an output of an MEMS resonator is fed to a TIA, so as to convert a current to a voltage, whereby an oscillator output is extracted from the current/voltage converting means via a buffer amplifier. Thus, the oscillator can reduce an influence of the TIA which contains high floor noise and improve phase noise characteristics of the oscillator.

Further, the oscillator according to the preferred embodiment of the present invention includes as the current/voltage converting means a coil in which one end is connected to ground and the other end is connected to the buffer amplifier, in such a manner that the coil is wound in a noncontact manner around a wiring line via which an output of the MEMS resonator is fed to the TIA. In the oscillator, the coil couples with the wiring line by electromagnetic induction so that a current flowing in the wiring line is converted to a voltage and the voltage is supplied to the buffer amplifier. Thus, the oscillator output is obtained from the buffer amplifier via the coil. This allows the oscillator to reduce the influence of the floor noise of the TIA and improve the phase noise characteristics of the oscillator output.

Moreover, the oscillator according to the preferred embodiment of the present invention includes as the current/voltage converting means a microstrip line in which one end is connected to ground and the other end is connected to the buffer amplifier, in such a manner that the microstrip line is provided adjacently to the wiring line that connects the MEMS resonator with a TIA input. In the oscillator, the microstrip line couples with the wiring line by electromagnetic induction so that the oscillator output is obtained via the microstrip line. This allows the oscillator to improve the phase noise characteristics and to be applicable even at high frequencies.

Furthermore, the oscillator according to the preferred embodiment of the present invention includes as the current/voltage converting means a first coil provided on the wiring line that connects the MEMS resonator with the TIA input, and a second coil provided opposed to the first coil in which second coil one end is connected to ground and the other end is connected to the buffer amplifier, thereby constituting a transformer. In this configuration, the oscillator output is obtained from the buffer amplifier via the second coil. This allows the oscillator to improve phase noise.

[First Embodiment: FIG. 1]

The following describes an oscillator according to the first embodiment of the present invention. FIG. 1 is a circuit diagram illustrating the oscillator according to the first embodiment of the present invention.

As illustrated in FIG. 1, the oscillator (first oscillator) according to the first embodiment includes a TIA 5, an MEMS resonator 7, a buffer amplifier 9, a resonator bias 10, and an oscillation output coil 11. Further, the TIA 5 includes an operation amplifier 6 and a negative feedback resistor 8 similarly to conventional techniques.

The oscillation output coil 11, which is a characteristic part of the first oscillator, is provided so as to wind in a noncontact manner around a wiring line 15 via which an output of the MEMS resonator 7 is fed to the TIA. One end of the oscillation output coil 11 is connected to ground and the other end thereof is connected to the buffer amplifier 9. Note that the wiring line 15 corresponds to "input wiring line" in claims.

The oscillation output coil 11 serves as current/voltage converting means which couples with the wiring line 15 by electromagnetic induction so as to convert a current flowing in the wiring line 15 to a voltage and output it to the buffer amplifier 9.

That is, the first oscillator is configured such that an oscillator output is extracted not from a TIA output but from the oscillation output coil 11.

This allows the first oscillator to reduce an influence of high-level floor noise of the TIA and to improve phase noise characteristics of the oscillator output.

Further, with the use of the electromagnetic induction, it is possible to reduce an influence of a load to an oscillation loop and to prevent load variation.

Figure 2:
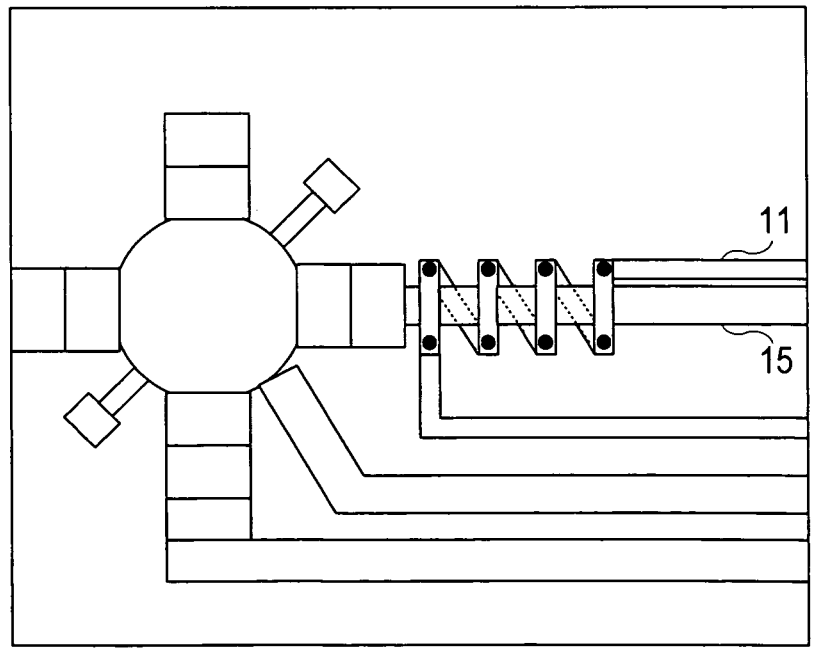
FIG. 2 is a schematic view illustrating a configuration of an MEMS resonator in a first oscillator.

[Configuration of MEMS Resonator in First Oscillator: FIG. 2]

Next will be explained a configuration of the MEMS resonator of the first oscillator with reference to FIG. 2. FIG. 2 is a schematic view illustrating the configuration of the MEMS resonator in the first oscillator.

As illustrated in FIG. 2, the MEMS resonator 7 (first MEMS resonator) of the first oscillator is configured such that the oscillation output coil 11 is provided around the wiring line 15 on a TIA-input side of a disk-type resonating element, which is the same as one used in the conventional techniques, in such a manner that the oscillation output coil 11 does not make contact with the wiring line 15.

That is, the first MEMS resonator 7 has a multilayer structure in which a lower-side portion of the oscillation output coil 11 is formed on an insulating layer, the wiring line 15 is formed thereon via an insulating layer, an upper-side portion of the oscillation output coil 11 is formed further thereon via an insulating layer, and the upper-side portion and the lower-side portion of the oscillation output coil 11 are connected with each other via through holes with the wiring line 15 sandwiched therebetween so as to form a coil.

Further, when an oscillator frequency is high and capacitance is formed, the oscillation output coil 11 does not function as a coil. In view of this, in a case where the frequency is high, the number of windings of the oscillation output coil 11 is reduced to adjust the frequency. Normally, the number of windings is set according to an oscillator frequency to be used, so as to obtain optimum characteristics.

[Effect of First Embodiment]

In accordance with the oscillator according to the first embodiment of the present invention, the oscillator including the MEMS resonator 7, the TIA 5, and the buffer amplifier 9 further includes the oscillation output coil 11 in which one end is connected to ground and the other end is connected to the buffer amplifier 9, which oscillation output coil 11 is provided so as to surround in a noncontact manner the wiring line 15 that connects the MEMS resonator 7 with a TIA-input side. In this configuration, the oscillation output coil 11 couples with the wiring line 15 by electromagnetic induction, thereby converting a current to a voltage and supplying it to the buffer amplifier 9. As such, an oscillator output can be extracted not from a TIA-output side but from the oscillation output coil 11, thereby yielding such an effect that an influence of the floor noise of the TIA can be reduced and phase noise characteristics of the oscillator output can be improved.

Figure 4:
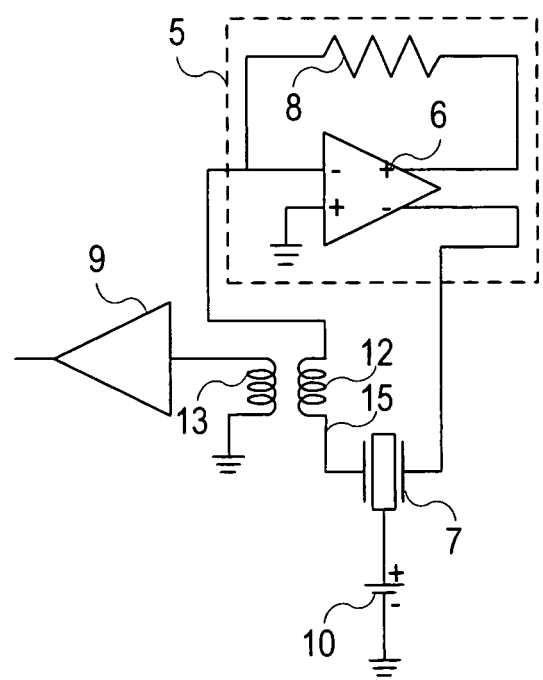
FIG. 4 is a circuit diagram of an oscillator according to the second embodiment of the present invention.

[Second Embodiment: FIG. 4]

Next will be explained an oscillator according to the second embodiment of the present invention with reference to FIG. 4. FIG. 4 is a circuit diagram illustrating the oscillator according to the second embodiment of the present invention.

As illustrated in FIG. 4, the oscillator (second oscillator) according to the second embodiment is basically constituted by a TIA 5, an MEMS resonator 7, and a buffer amplifier 9, similarly to the first oscillator. As a characteristic part of the second oscillator, the second oscillator includes: a coil (TIA-input-side coil) 12 provided on an input wiring line via which an output of the MEMS resonator 7 is fed to the TIA 5; and an oscillation-output-side coil 13 in which one end is connected to ground and the other end is connected to the buffer amplifier 9, which oscillation-output-side coil 13 is provided opposed to the TIA-input-side coil 12.

That is, in the second oscillator, the TIA-input-side coil 12 and the oscillation-output-side coil 13 constitute a transformer so that a current flowing in the TIA-input-side coil 12 is converted to a voltage in proportion to the number of windings of the oscillation-output-side coil 13 and the voltage is outputted to the buffer amplifier 9. The transformer constituted by the TIA-input-side coil 12 and the oscillation-output-side coil 13 serves as current/voltage converting means. The TIA-input-side coil 12 corresponds to "first coil" in claims, and the oscillation-output-side coil 13 corresponds to "second coil" in claims.

With the configuration, in the second oscillator, an oscillator output can be extracted not from a TIA-output side but via the oscillation-output-side coil 13, thereby making it possible to reduce an influence of the floor noise of the TIA 5 and to improve phase noise characteristics of the oscillator output.

Figure 5:
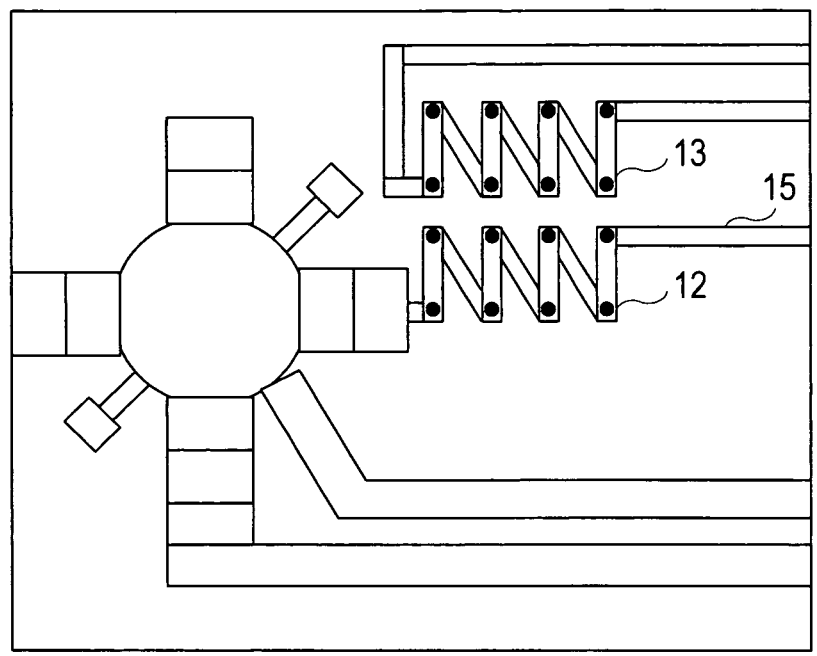
FIG. 5 is a schematic view illustrating a configuration of an MEMS resonator in a second oscillator.

[Configuration of MEMS Resonator in Second Oscillator: FIG. 5]

Next will be explained a configuration of the MEMS resonator of the second oscillator with reference to FIG. 5. FIG. 5 is a schematic view illustrating the configuration of the MEMS resonator in the second oscillator.

As illustrated in FIG. 5, the MEMS resonator 7 (second MEMS resonator) of the second oscillator includes a disk-type resonating element, which is the same as one provided in the aforementioned first oscillator, and is configured such that the TIA-input-side coil 12 is connected in series to a wiring line 15 provided on a TIA-input side of the disk-type resonating element, and further, the oscillation-output-side coil 13 is provided opposed to the TIA-input-side coil 12.

As apparent from FIG. 5, the TIA-input-side coil 12 and the oscillation-output-side coil 13 are configured such that no wiring line passes therethrough. This accordingly makes it possible to reduce the number of layers and to reduce the number of production processes, thereby reducing production cost.

Figure 6:
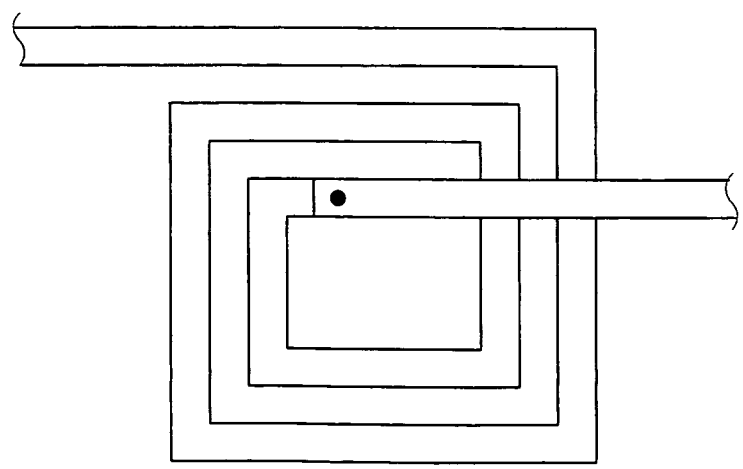
FIG. 6 is a schematic view illustrating another coil of a second MEMS resonator.
Figure 7:
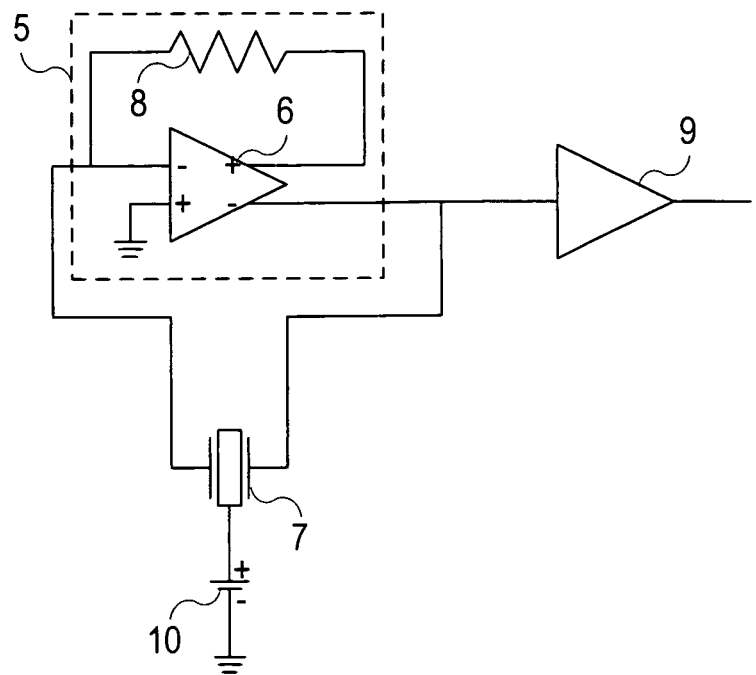
FIG. 7 is a circuit diagram illustrating an example of an oscillator using a conventional MEMS resonator.
Figure 8:
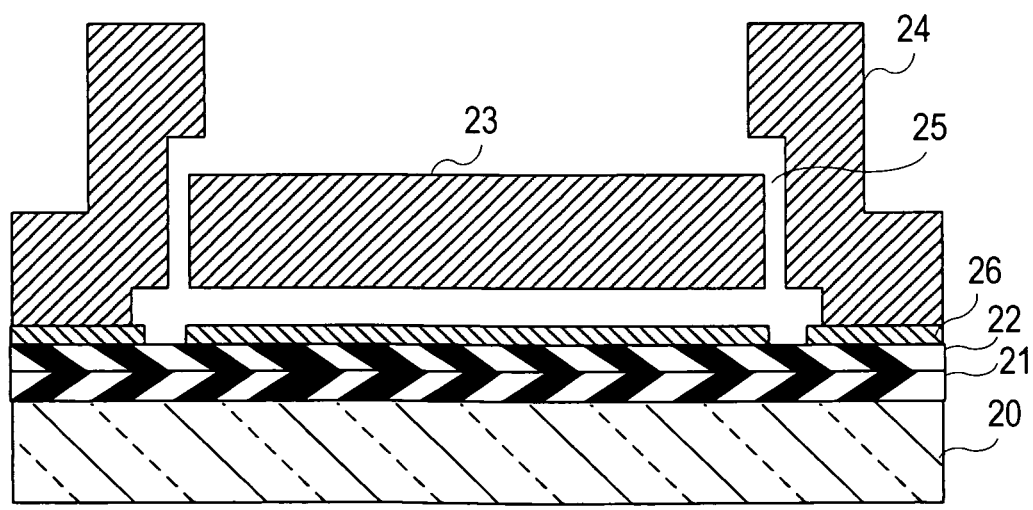
FIG. 8 is an explanatory view illustrating a conventional disk-type MEMS resonator.

[Another Configuration of Second MEMS Resonator: FIG. 6]

Next will be explained another configuration of the second MEMS resonator with reference to FIG. 6. FIG. 6 is a schematic view illustrating another coil of the second MEMS resonator.

In the aforementioned second MEMS resonator, two coils are placed side by side in a horizontal direction so as to form a transformer. On the other hand, in another configuration, two coils are placed so that they are superimposed one on the other in a vertical direction with respect to a substrate so as to constitute a transformer.

FIG. 6 illustrates a shape of a coil to be used as the TIA-input-side coil 12 or the oscillation-output-side coil 13. In FIG. 6, a metal wire is wound in a whirl so as to form a coil shape. The coil shape partially forms a multilayer structure so as not to short-circuit.

The two coils are placed to be superimposed one on the other in such a manner that the two coils face each other with an insulating layer sandwiched therebetween, thereby causing the two coils to function as a transformer.

Note that what these coils are connected with is the same as the configuration illustrated in FIG. 5. That is, the coil to be used as the TIA-input-side coil 12 is connected to an electrode of the resonator 7 and an input-side wiring line of the TIA 5, and the coil to be used as the oscillation-output-side coil 13 is connected to a GND electrode and the buffer amplifier 9.

As such, the TIA-input-side coil 12 and the oscillation-output-side coil 13 are provided in layers in a vertical direction via an insulating layer. This makes it possible to reduce a chip area so that the oscillator can be downsized.

Figure 3:
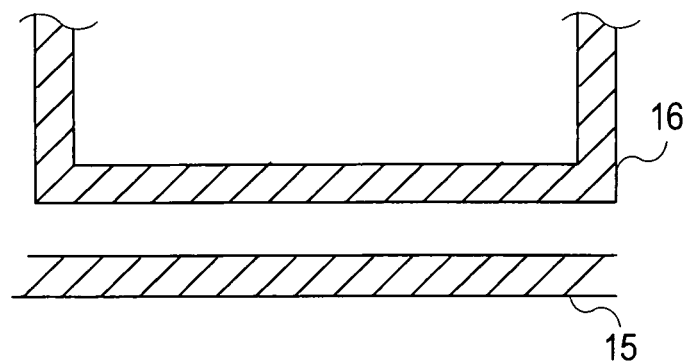
FIG. 3 is a schematic view illustrating a configuration of a second MEMS resonator in which a microstrip line is used.

[Configuration Using Microstrip Line: FIG. 3]

As a modified example of the second MEMS resonator, the following explains about a configuration using a microstrip line with reference to FIG. 3. FIG. 3 is a schematic view illustrating the configuration of the second MEMS resonator in which a microstrip line is used.

As illustrated in FIG. 3, the modified example of the second MEMS resonator is configured such that instead of the coil, a microstrip line is used as the current/voltage converting means to extract an oscillator output. In the modified example, a microstrip line 16 is provided adjacently to and substantially in parallel with the wiring line 15 that connects the MEMS resonator 7 with the TIA-input side.

The microstrip line 16 is configured such that one end thereof is connected to ground and the other end thereof is connected to the buffer amplifier 9, in a similar manner to the oscillation-output-side coil 13. The microstrip line 16 couples with the wiring line 15, which is provided adjacently thereto, by electromagnetic induction, thereby converting a current flowing in the wiring line 15 to a voltage and outputting it to the buffer amplifier 9. The thickness and width of the microstrip line 16 and the distance between the microstrip line 16 and the wiring line 15 can be designed as appropriate so as to obtain intended characteristics.

With the use of the microstrip line 16, even if an oscillator frequency becomes high, less capacitance is formed so that variation in characteristics is restrained, thereby making it possible to apply the oscillator at higher frequencies.

[Effect of Second Embodiment]

In accordance with the oscillator according to the second embodiment of the present invention, the oscillator including the MEMS resonator 7, the TIA 5, and the buffer amplifier 9 further includes the TIA-input-side coil 12 provided in series to the wiring line 15 that connects the MEMS resonator 7 with the TIA-input side, and the oscillation-output-side coil 13 in which one end is connected to ground and the other end is connected to the buffer amplifier 9, which oscillation-output-side coil 13 is provided opposed to the TIA-input-side coil 12. In the oscillator, the TIA-input-side coil 12 and the oscillation-output-side coil 13 form a transformer so as to convert a current to a voltage and supply the voltage to the buffer amplifier 9. Thus, an oscillator output can be extracted not from the TIA-output side but from the oscillation-output-side coil 13. As a result, such effects can be obtained that an influence of the floor noise of the TIA is reduced and the phase noise characteristics of the oscillator output are improved, and that the oscillator can be produced easily because no wiring line should be formed in the coils.

Further, in accordance with another configuration of the oscillator, the TIA-input-side coil 12 and the oscillation-output-side coil 13, which constitute a transformer, are provided in a whirl and in layers so that they face each other with an insulating layer sandwiched therebetween in a vertical direction with respect to a substrate. The configuration yields such an effect that a space necessary for the coils to be placed is reduced, thereby downsizing the oscillator in total.

Moreover, in the second oscillator, instead of the oscillation-output-side coil 13, the microstrip line 16 in which one end is connected to ground and the other end is connected to the buffer amplifier 9 is provided adjacently to the wiring line 15 on the TIA-input side, so that the microstrip line 16 couples with the wiring line by electromagnetic induction, thereby converting a current to a voltage. The configuration accordingly yields such effects that the oscillator output can be extracted from the microstrip line 16 so that the phase noise characteristics of the oscillator output can be improved, and that the oscillator is applicable at high frequencies because capacitance is hardly formed.

Thus, the present invention is suitable for an oscillator that can improve the phase noise characteristics.

What is claimed is:

1. An oscillator comprising:
a resonator provided on a substrate;
an amplifying element for oscillations;
a buffer amplifier for extracting an oscillator output; and
current/voltage converting means that couples, by electromagnetic induction, with an input wiring line via which an output of the resonator is fed to the amplifying element, so as to convert a current flowing in the input wiring line to a voltage and output the voltage to the buffer amplifier.

2. The oscillator according to claim 1, wherein:
the current/voltage converting means is a coil provided so as to surround the input wiring line in a noncontact manner, in which coil one end is connected to ground and the other end is connected to the buffer amplifier.

3. The oscillator according to claim 1, wherein:
the current/voltage converting means is a microstrip line placed adjacently to and substantially in parallel with the input wiring line, in which microstrip line one end is connected to ground and the other end is connected to the buffer amplifier.

4. The oscillator according to claim 1, wherein:
the current/voltage converting means is a transformer constituted by a first coil and a second coil, the first coil is provided on the input wiring line, and the second coil in which one end is connected to ground and the other end is connected to the buffer amplifier is provided opposed to the first coil.

5. The oscillator according to claim 4, wherein:
the first coil and the second coil are placed in parallel with each other in a horizontal direction with respect to the substrate.

6. The oscillator according to claim 4, wherein:
the first coil and the second coil are placed so that they are superimposed one on the other via an insulating layer in a vertical direction with respect to the substrate.

* * * * *